Oct. 1, 1968 J. LINDMAYER ET AL 3,404,318

NEGATIVE RESISTANCE DIODE

Filed May 8, 1964

INVENTORS:
Joseph Lindmayer
Charles Wrigley

BY Connolly and Hutz
ATTORNEYS

United States Patent Office 3,404,318

Patented Oct. 1, 1968

3,404,318

NEGATIVE RESISTANCE DIODE

Joseph Lindmayer and Charles Y. Wrigley, Williamstown, Mass., assignors to Sprague Electric Company, North Adams, Mass., a corporation of Massachusetts Continuation-in-part of application Ser. No. 288,798, June 18, 1963. This application May 8, 1964, Ser. No. 366,104

7 Claims. (Cl. 317—234)

ABSTRACT OF THE DISCLOSURE

Negative resistance diode has semiconductor body with a first zone of one conductivity type and a high carrier concentration forming a junction, preferably of the micro type, with a second zone of the opposite conductivity type and extremely low carrier concentration, the second zone merging into a third zone having the same conductivity type but with much higher carrier concentration, the third zone forming another junction with a fourth zone having the first type of conductivity and a high carrier concentration. The third and fourth zones are short-circuited together by an external ohmic conductor. Terminals are connected to the first zone and to the short-circuiting connector, and the application of a very high frequency voltage between these terminals causes the diode to develop a negative resistance at relatively low voltages. The diode is particularly desirable for use in a heterodyne stage such as in a UHF television receiver and will provide conversion with substantial gain.

The present application is a continuation-in-part of application Ser. No. 288,798 filed June 18, 1963 now Patent No. 3,365,627.

The present invention relates to radio-frequency driven diodes of the type that exhibit a negative resistance characteristic; that is, under some conditions of use a change of voltage across the diode causes a change of current flow opposite to that of the voltage change.

Among the objects of the present invention is the provision of a novel form of negative resistance diode which has desirable characteristics and is well suited to manufacture by mass production.

Another object of this invention is the provision of a negative resistance diode that is readily reproducible to a high degree.

Another object is to provide an RF-driven negative-resistance diode that is insensitive to ambient influences.

Additional objects include the provision of novel circuits in which the RF-driven negative-resistance diodes of this invention are very effectively used.

The foregoing as well as additional objects of the present invention will be more fully appreciated from the following description of several of its exemplifications, reference being made to the accompanying drawings wherein.

Figures 1, 2, 3, 4:
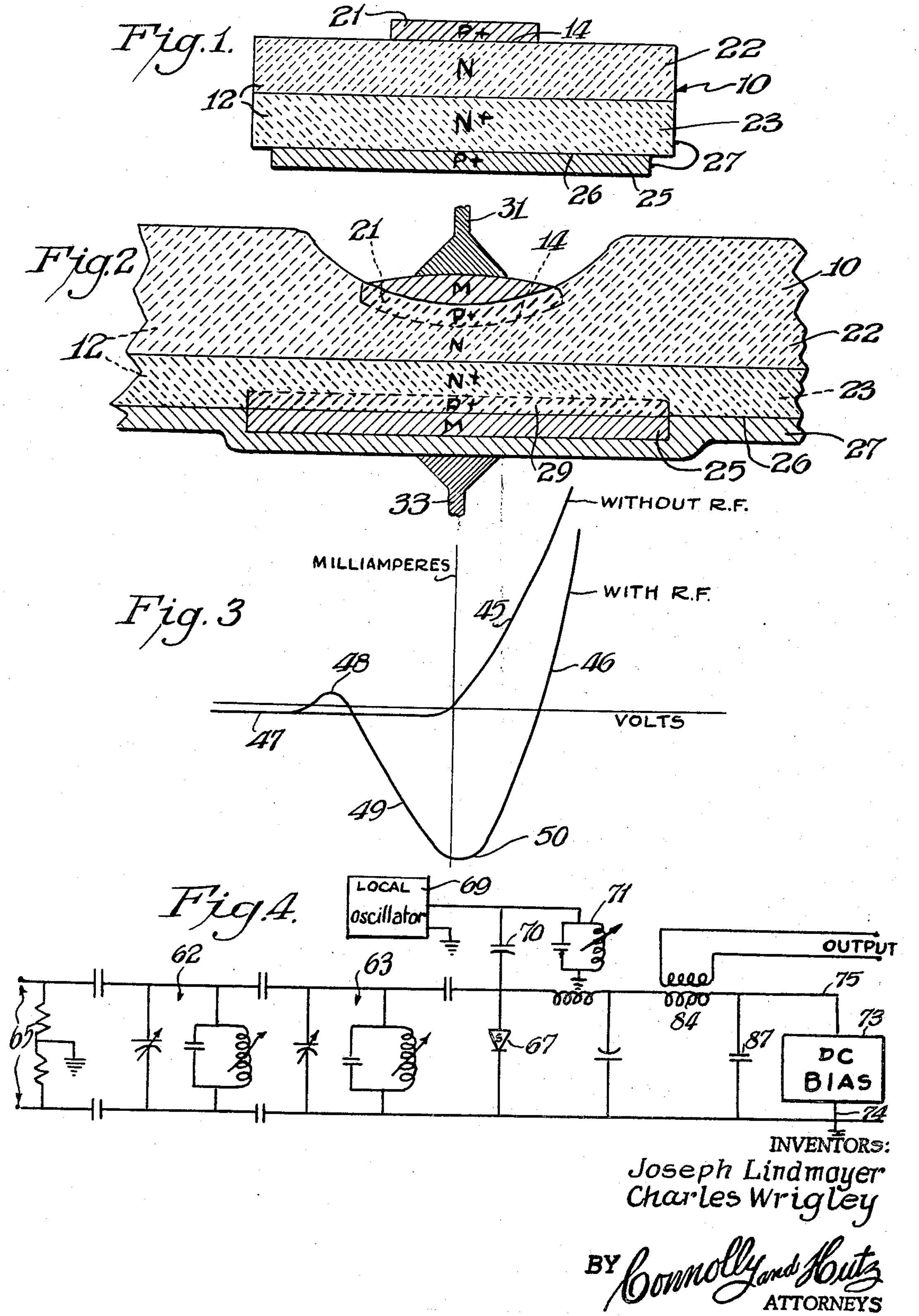
FIGURE 1 is a cross-section of a stylized showing of the diode of this invention.
FIGURE 2 is a sectional view of one specific embodiment of a diode according to this invention.
FIGURE 3 is a curve diagram illustrating the negative resistance characteristics of the diode of FIGURE 1.
FIGURE 4 is a circuit diagram of a heterodyne circuit in which the diode of FIGURE 1 can be used.

In general the objects of this invention are attained by a semiconductor device having a main diode junction between a heavily doped region of a first conductivity type and a much lower (about three orders) doped region of a second conductivity type, the lower doped region merging into a heavily doped region of the second conductivity type which is provided with a secondary junction to a heavily doped rectifying contact zone of the first conductivity type, and a conducting path joining the heavily doped region of second conductivity type and the rectifying zone.

In a specific embodiment, the junction of the rectifying contact zone is shorted to the dual regions of the second conductivity type by a metallic surface coating that is in ohmic contact to the semiconductor.

When periodic high-frequency excitation voltage is applied to the diode of this invention, injection produces minorty storage adjacent to the main diode junction. The subsequent reverse period of the applied voltage reclaims the stored carriers plus additional charge. This is accomplished partly because simultaneous injection occurs at the secondary junction as long as the excess majority supply lasts. In addition the advancing space-charge is deterred, producing a momentary high-field multiplication. The net result of these processes is that the charge which flows during the reverse transient exceeds the charge initially stored.

A particularly desirable form of negative resistance diode comprises a semiconductor body which has a junction between a first zone doped to provide at least about $10^{17}$ impurity atoms per cubic centimeter and a second zone having less than about $10^{14}$ impurity atoms per cubic centimeter, a third zone having the same type of conductivity as the second zone and at least about $10^{17}$ impurity atoms per cubic centimeter, the third zone merging into the second zone over a distance of about 0.1 mil, a rectifying contact engaging a portion of the third zone to form a junction therewith, and an ohmic conductor connecting another portion of the third zone with the rectifying contact.

The rectifying contact and the ohmic conductor can be electroplated, and the ohmic conductor can merely be a coating that covers the rectifying contact and extends beyond it so as to contact the third semiconductor zone.

Very desirable embodiments of the foregoing produced negative-resistance diode have the pn junction of the micro-alloy type. In addition, the rectifying contact extends over about the same area as the pn junction and is directly opposite it.

Diodes constructed in the above manner have a particularly low negative resistance; that is, a small change in voltage will produce a large oppositely directed change in current. These diodes are accordingly of considerable value for connection in circuits in which the low value negative resistance is conveniently utilized for producing power gain or bistable operation.

A particularly desirable circuit for utilizing the diode of this invention is a heterodyne stage, such as is used for UHF television reception for example. Such a stage when equipped with the subject diode, can be made to provide gain, due to its negative resistance when supplied with signals throughout the range of frequencies of the mixer circuit. The mixer circuit is supplied by a local oscillator at a frequency higher than the UHF signals to be received. The mixer delivers the difference frequency with gain. The circuit includes inductive elements connected to overcome the capacitance of the diode and DC bias is provided to bias the diode at a potential that keeps it in its negative resistance condition.

The negative resistance of the diode of the present invention is developed when an RF signal of sufficient amplitude is applied across the diode. Varying the magnitude of the RF signal also varies the voltage range over which the negative resistance characteristic extends. An RF voltage of about one-half volt or more is generally sufficient for operation.

The diodes of the present invention are improved forms of the diodes described in prior patent application Ser. No. 288,798 filed June 18, 1963, now Patent No. 3,365,-627 and the disclosure of that application is included in the present specification as though fully set forth herein.

Turning now to the drawing forming a part of the disclosure of the present invention, the diodes of FIGURE 1 and FIGURE 2 are somewhat similar to the diode of our above-identified prior application. It has a wafer body 10 of germanium, silicon or other semiconductor with an active thickness 12 of about 0.2 mil or less. Such thickness can be attained by any of the methods known in the semiconductor art, and is conveniently provided by starting with a thicker semiconductor wafer and electrolytically etching a depression into one or both faces of the wafer, as described for example in U.S. Patent 2,870,052 granted Jan. 20, 1959.

A junction 14 is provided in the active portion 12 of the wafer 10 by heavy doping that produces a zone 21 having preferably more than $10^{18}$ impurity atoms per cubic centimeter. A suitable doping technique for a micro-alloy junction is also described in the above-identified patent, although any other technique can also be used.

Adjacent the opposite face of wafer 10 is another zone 23 doped to about $10^{16}$ to $10^{17}$ impurity atoms per cubic centimeter, but the impurity atoms of zone 23 are of opposite conductivity as compared with those of zone 21.

Between zones 21 and 23 is a zone 22 which is of the same type of conductivity as zone 23 and in which the concentration of impurity atoms gradually reduces from the high concentration of zone 23 to a level below $10^{14}$ impurity atoms per cubic centimeter at junction 14. In other words, the junction 14 is a relatively abrupt one with heavy doping on one side and little or no doping on the other; the lightly doped or undoped zone gradually merging into a more heavily doped zone without any further junction. Thus, the doping of zones 22 and 23 has a graded impurity distribution.

A feature of the present invention is the addition of a rectifying contact 25 on the lower face 26 of zone 23 at an area opposite the junction 14, and a conducting path 27 connecting the lower face 26 with the rectifying contact 25.

The diode of this invention is preferably terminated by terminal leads 31, 33 ohmically connected to zone 21 and conducting path 27, respectively, as by soldered contacts which may be made in the manner described in the foregoing patent, or by any other suitable arrangement.

Rectifying contact 25 is preferably a metal that tends to impart to the semiconductor body a conductivity opposite that of zone 23. The thickness of the rectifying contact is not critical. Ohmic conductor 27 is preferably a metal such as silver or gold that does not affect the conductivity of the semiconductor body.

Zone 21 is preferably less than about 60 square mils in transverse area in order to achieve high frequency performance. In addition, the lightly doped zone 22 between junction 14 and zone 23 is preferably 0.1 mil or less in thickness.

The diodes of the present invention differ from those of our above-noted prior application by including the rectifying contact 25. It has been discovered that the presence of this additional element greatly improves the reproducibility of the negative resistance characteristics and also improves the negative resistance itself by reducing its absolute magnitude. In a production-type run one hundred diodes were made in accordance with the respective inventions and the diodes of the present invention were all acceptable, whereas many of those made pursuant to the prior application were not.

A typical diode of the present invention has characteristics illustrated in FIGURE 3. In this figure, curve 45 gives the voltage-current relationship of the diode when the applied voltage is pure DC. Curve 45 is not distinguishable from similar curves for diodes in general. When an RF signal having a frequency of about 1 megacycle or more and an amplitude of about ½ volt or more is applied to the diode in addition to the DC voltage, then its voltage-current characteristic follows the curve 46. At their extreme reverse voltage portions both curves 45 and 46 merge together as shown at 47. However, as the voltage approaches the forward current direction, curve 46 goes through a peak 48 in the forward conductive direction and then drops along a fairly steep slope 49 to an inverse peak 50 in the reverse conductive direction. Further increases in voltage in the forward conductive direction cause the reverse current to fall off and change to forward direction current along curve 46 approaching the corresponding portion of curve 45.

The steepness of slope 49 can be better appreciated by noting that the reverse peak 50 will generally have a magnitude of about 6 to 10 milliamperes. In other words, over a voltage spread between peaks 48 and 50, the current will show a change corresponding to a negative conductance of 2500 microohms or more.

One significant aspect of the negative resistance diodes of this invention is the secondary junction that helps supply current carriers that carry current in a direction opposite to that of the forward current across the principal junction.

Junction 14 can also be made by diffusing one or more junctions through windows in an $SiO_2$ coating on the outer surface of an epitaxially grown silicon layer that forms the secondary junction with a silicon body on which it is grown.

By way of example only, a typical diode of this invention as depicted in FIGURE 2 comprises a body 10 of germanium having a region 22 of N-type conductivity produced by doping with $10^{14}$ impurity atoms per cubic centimeter of antimony. Zone 21 is produced by diffusing about $10^{18}$ atoms per cubic centimeter of cadmium to provide P-type conductivity. Zone 23 is doped with about $10^{16}$ to $10^{17}$ atoms per cubic centimeter of antimony. Zone 29 formed by the rectifying contact 25 is doped with about $10^{18}$ atoms per cubic centimeter of cadmium. Zones 23 and 29 are ohmically short-circuited by contact 25 and a silver coating 27.

The diodes of the present invention also show the frequency dependent characteristics described in our prior application and they are accordingly suitable for use in the various types of circuits therein described.

FIGURE 4 shows the circuit of a presently commercial heterodyne stage in which the negative resistance of the RF-driven diodes of this invention provides very desirable results. The circuit of FIGURE 4 has an input network which can be of any convenient form but is illustrated as having two tuned resonant circuit sections 62, 63 fed from a balanced input 65 which can be directly connected to a television antenna, and delivering signals across mixer diode 67. A local oscillator 69 delivers oscillations of selectable frequency through coupling capacitor 70 to the mixer diode. A tunable resonant circuit section 71 is connected across the output of the local oscillator and by tuning circuit section 71 to a frequency slightly above the frequency of the oscillations this circuit section will present across the diode an inductance that balances out the capacitance the diode presents if this circuit section is not used.

Mixer diode 67 is the negative resistance diode of this invention. In order to make sure diode 67 operates within is negative resistance range, it can be subjected to a DC bias from a bias source 73. One terminal 74 of the source is shown as directly grounded, the other terminal 75 being connected to the ground side of output transformer primary 84. Blocking capacitor 87 supplies all the filtering that may be needed.

DC biasing voltages useful in the above circuit can be anywhere between the peak 48 of FIGURE 3 or the inverse peak 50. A bias that holds the characteristics to the steepest portion of slope 49 gives the greatest gain and generally from 1/10 to about 4 volts will cover the steepest portion. However, no bias is needed if the slope at the 0 volt axis is sufficient to provide whatever gain is desired. This gain is generally less than half the maximum gain available but it has the advantage that because of the absence of DC bias the entire conversion circuit is simpler to construct and to use.

The foregoing conversion gains seem to require the mixing of the incoming signals with local oscillations that have a higher frequency than those signals. With the local oscillations at a frequency lower than that of the incoming signals, it appears impossible to obtain a gain higher than about 2. However, even this is better than the gains of less than one normally obtained from ordinary mixer diode circuits.

The conversion circuits of the present invention can also be used with other types of signals such as FM signals in the home broadcast range (88 to 108 megacycles per second) or in higher frequencies up to 1000 megacycles per second or higher. Higher gains are available with local oscillations of 10 or more megacycles per second. A mixer circuit of the present invention can be the only conversion circuit in a signal receiver or it can be one of the two or more converters that multiple-conversion receivers use. All such multiple-conversion stages can also be of the negative resistance type.

Obviously many modifications and variations of the present invention are possible in the light of the above teachings. It is, therefore, to be understood that within the scope of the appended claims the invention may be practiced otherwise than as specifically described.

What is claimed is:

1. A semiconductor diode consisting essentially of a main diode junction between a heavily doped region of a first conductivity type and a much lighter doped region of a second conductivity type, said lighter doped region being merged with a heavily doped region of said second conductivity type, a second junction formed between said heavily doped second conductivity region and a second heavily doped zone of said first conductivity type, and an ohmic conductor short-circuiting said heavily doped second conductivity type region to said second heavily doped first conductivity type region.

2. A diode that develops negative resistance when RF-driven, said diode comprising a semiconductive body having a junction between a first zone of one conductivity type doped to provide at least about $10^{17}$ impurity atoms per cubic centimeter and a second zone of opposite conductivity type having less than about $10^{14}$ impurity atoms per cubic centimeter, a third zone having the same type of conductivity as the second zone and at least about $10^{17}$ impurity atoms per cubic centimeter, the third zone merging into the second zone, a rectifying contact engaging a portion of the third zone, and an ohmic conductor short-circuiting another portion of the third zone to the rectifying contact.

3. The combination of claim 2 in which the rectifying contact is an electroplated coating.

4. The combination of claim 2 in which the ohmic conductor is a coating that covers the rectifying contact and extends over the surface of the third zone adjacent the rectifying contact.

5. The combination of claim 2 in which the ohmic conductor is an electroplated coating.

6. A diode with negative resistance characteristics, said diode having a germanium body with a zone containing less than about $10^{14}$ impurity atoms per cubic centimeter, a micro-alloy pn junction between said zone and a micro zone having at least about $10^{17}$ impurity atoms per cubic centimeter, the first-mentioned zone merging without a junction into a further zone having at least about $10^{17}$ impurity atoms per cubic centimeter, a rectifying coating engaging a small portion of the last-mentioned zone, said rectifying coating being of a metal that gives the germanium a conductivity opposite that of the last-mentioned zone, an ohmic coating overlying the rectifying coating and in contact with adjacent portions of the last-mentioned zone, a first terminal lead ohmically connected to the micro zone, and a second terminal connected to the ohmic coating.

7. A heterodyne stage for UHF television reception, said stage having a diode mixer circuit in which the diode is the diode of claim 1 and has negative resistance when biased with signals in the range of frequencies through which the mixer circuit is operated, the mixer circuit having oscillation supply means connected to supply to the mixer circuit oscillations at a frequency higher than the UHF signals to be received, and an output network connected to deliver the heterodyne product of the UHF signals and the oscillations, the mixer circuit including inductive elements connected to overcome the capacitance of the load presented by the diode, and DC bias means connected to bias the diode at a potential that keeps it in its negative resistance condition.

References Cited

UNITED STATES PATENTS

| | | | |
|---|---|---|---|
| 2,967,793 | 1/1961 | Philips | 317—235.40 |
| 3,015,048 | 12/1961 | Noyce | 317—235.44 |
| 3,226,609 | 12/1965 | Palmer | 317—235.44 |

JOHN W. HUCKERT, *Primary Examiner.*

J. D. CRAIG, *Assistant Examiner.*